United States Patent [19]

Morikawa et al.

[11] Patent Number: 5,484,013
[45] Date of Patent: Jan. 16, 1996

[54] HEAT SINK FAN

[75] Inventors: Fumihiro Morikawa, Yonago; Hiroaki Saeki, Sakaiminato, both of Japan

[73] Assignee: Nippon Densan Corporation, Kyoto, Japan

[21] Appl. No.: 246,796

[22] Filed: May 20, 1994

[30] Foreign Application Priority Data

| May 27, 1993 | [JP] | Japan | 5-151450 |
| Jun. 24, 1993 | [JP] | Japan | 5-180658 |
| Jul. 30, 1993 | [JP] | Japan | 5-045959 |
| Nov. 24, 1993 | [JP] | Japan | 5-067643 |

[51] Int. Cl.⁶ .................. F28F 7/00; F28F 13/12
[52] U.S. Cl. .......... 165/80.3; 165/122; 165/185; 174/16.3; 361/697
[58] Field of Search ............ 165/80.3, 121, 165/122, 125, 185; 174/16.1, 16.3; 257/713, 721, 722, 718; 361/692, 694, 695, 697

[56] References Cited

U.S. PATENT DOCUMENTS

| 3,285,328 | 11/1966 | Woodward | 165/121 X |
| 4,513,812 | 4/1985 | Papst et al. | 165/121 X |
| 4,679,118 | 7/1987 | Johnson et al. | 174/16.3 X |
| 5,282,111 | 1/1994 | Hopfer | 174/16.3 X |
| 5,288,203 | 2/1994 | Thomas | 165/124 X |

FOREIGN PATENT DOCUMENTS

| 9301744 | 5/1993 | Germany . | |
| 49700 | 8/1985 | Japan . | |
| 113460 | 1/1987 | Japan . | |
| 203555 | 8/1990 | Japan | 257/718 |
| 00751 | 1/1989 | WIPO . | |

OTHER PUBLICATIONS

"Thermal Enhancement Technique For Plastic IC Packages", Research Disclosure, Aug. 1992, No. 340, p. 34065, Author unknown.

D. H. Kekas et al., "Snap–Together Cooling Fan Assembly", IBM TDB, vol. 22, No. 6, Nov. 1979, pp. 2391–2392.

Author Unknown, "Snap-Lock Fan Holder", IBM Technical Disclosure Bulletin, vol. 34, No. 11, Apr. 1992, pp. 34–35.

*Primary Examiner*—Leonard R. Leo
*Attorney, Agent, or Firm*—McCormick, Paulding & Huber

[57] ABSTRACT

A heat sink fan has a fan motor provided with blades, a rectangular upper casing for holding the fan motor, and a rectangular lower casing fixed to the upper casing. The lower casing has a bottom portion and fin dissipating fins erected perpendicularly from the four side edges of the bottom portion. The upper and lower casings are fixed together by a mechanically interlocking mechanism consisting of a combination of pawls and pawl receiving portions, a combination of projections each having an inflated portion and cavities or a combination of hooks and engaging grooves formed or in the upper or lower casing. Fin portions are formed on the whole area or the area except for the fan motor and the blades to increase a heat dissipating efficiency.

7 Claims, 15 Drawing Sheets

HEAT SINK FAN

BACKGROUND OF THE INVENTION

1. Field of the Invention

The present invention relates to a heat sink fan, and more particularly to a heat sink fan mounted on an electric component or an electric instrument such as an integrated circuit, for cooling the same.

2. Description of the Related Arts

A small heat sink fan is widely used for cooling an instrument which houses many electric parts, such as an OA instrument, a medical instrument or an experimental instrument. In FIGS. 1 and 2 is shown a small heat sink fan used as a heat generation preventing apparatus. As shown in these figures, a heat sink fan 1 is of an axial type and comprises an upper casing 2 having a rectangular shape as viewed from above, a lower casing or a heat sink 3 having a rectangular shape as viewed from above, and a fan motor 1A including a propeller-shaped impeller 4 and others.

The upper and lower casings 2 and 3 define a space in which the fan motor 1A rotates. A plurality of vents 5 for passing air are formed in the outer casing 2. Integral connection portions 7 each having a blind end are formed on the four corners of the outer casing 2 (FIG. 2). The lower casing 3 forming a heat sink comprises a blind bottom portion or a bottom portion 8 formed with a punched window of a circular shape or any other shape (not shown), heat dissipating fins 9 rising from the side edges of the bottom 8 and connecting portions 11 provided with projections 10 received in the respective blind holes 6 of the upper casing 2 and formed on the four corners of the lower casing 3.

The impeller 4 is provided with a cup-shaped rotating member 12, and a plurality of blades 13 projecting radially outward from the outer periphery of the cup-shaped rotating member 12. A rotary shaft 14 is rotatably supported in a cylindrical central inner sleeve of the upper casing 2 by means of bearings 15, and the lower end of the rotary shaft 14 is fitted in a central through hole of the cup-shaped rotating member 12. A rotor magnet 16 is fixed to the inner periphery of the cup-shaped rotating member 12 by means of a yoke 12a. The cup-shaped rotating member 12, the yoke 12a and the rotator magnet 16 constitute a rotor 17. On the inner boss of the outer casing 2 is mounted a stator 18 comprising a stator core having a plurality of teeth arranged circumferentially of the inner boss, and a coil wound around the teeth.

One casing must be disposed just over the other casing and fixed to the other casing by holding them in parallel and by adjusting them. Thus, the assembly requires special attention and skill.

When an electric instrument on which such a heat sink fan is mounted receives shocks during its movement, transportation or operation, the upper and lower casings are separated easily from each other to prevent the fan motor 1A from operating properly. Because the upper and lower casings are assembled together merely by tightly inserting projections into blind holes having the same diameter as the projections.

In order to solve these problems, the upper and lower casings may be fixed together by means of an adhesive, a screw or other fixing means. However, these means are not preferable, because processes and a number of parts increase. It is desired, therefore, that both casings be undetachably connected together rapidly and easily by very simple means without increasing processes and a number of parts.

In use, the lower casing 3 is placed at its bottom portion 8 on an electric part 20 such as a chip of an IC or LSI. An electric power is supplied to the fan motor 1A through electric wires 21 to rotate the fan motor 1A. Then, the impeller 4 rotates, and air is introduced in the lower casing 3 through the heat dissipating fins 9, cools the bottom 8 and is exhausted axially through the vents 5. In this way, most heat generated from the electric part 20 is dissipated.

As a fan motor has become miniaturized, however, the size of the heat sink fan which houses the fan motor has become smaller and smaller. This compactness reduces the surface area of the lower casing and deteriorates heat dissipating efficiency of the lower casing. If, therefore, heat is not dissipated securely, heat generated from the electric part is likely to give the electric part itself an adverse effect.

SUMMARY OF THE INVENTION

An object of the present invention is to provide a heat sink fan provided with a mechanically interlocking mechanism for connecting an upper casing to a lower casing so that they are not disengaged from each other undesirably.

Another object of the present invention is to provide a heat sink fan and a heat sink whose heat dissipating effect is improved.

DETAILED DESCRIPTION OF THE PREFERRED EMBODIMENTS

The preferred embodiments of the present invention will be described with reference to the accompanying drawings.

Figure 1:
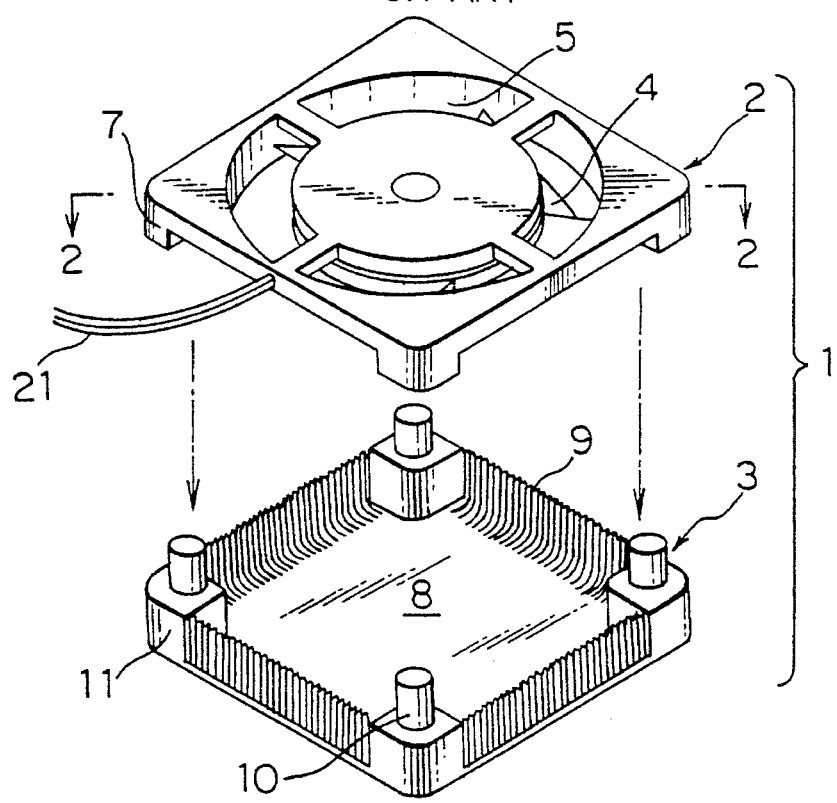
FIG. 1 is an exploded perspective view of a conventional heat sink fan.
Figure 2:
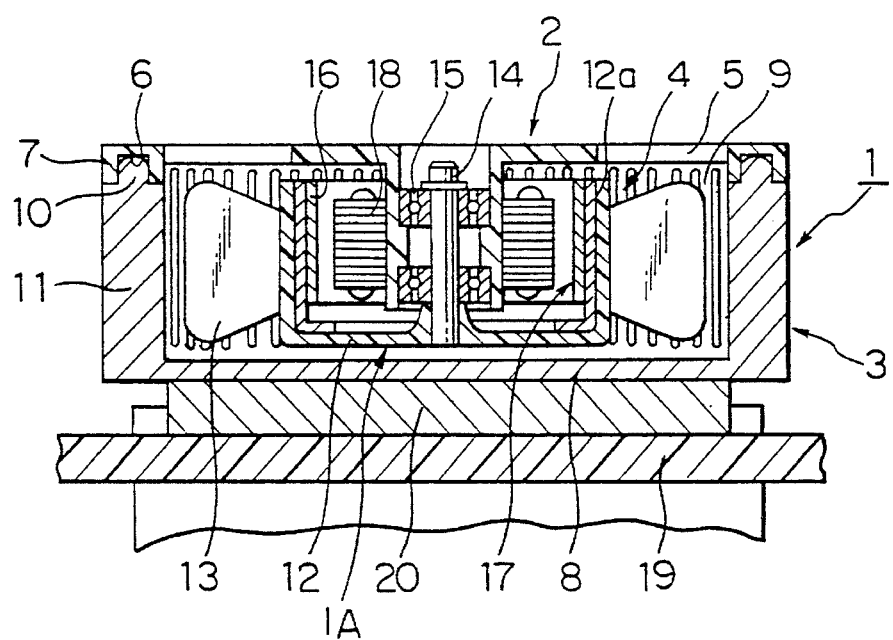
FIG. 2 is a cross-sectional view along line 2—2 of FIG. 1.
Figure 3:
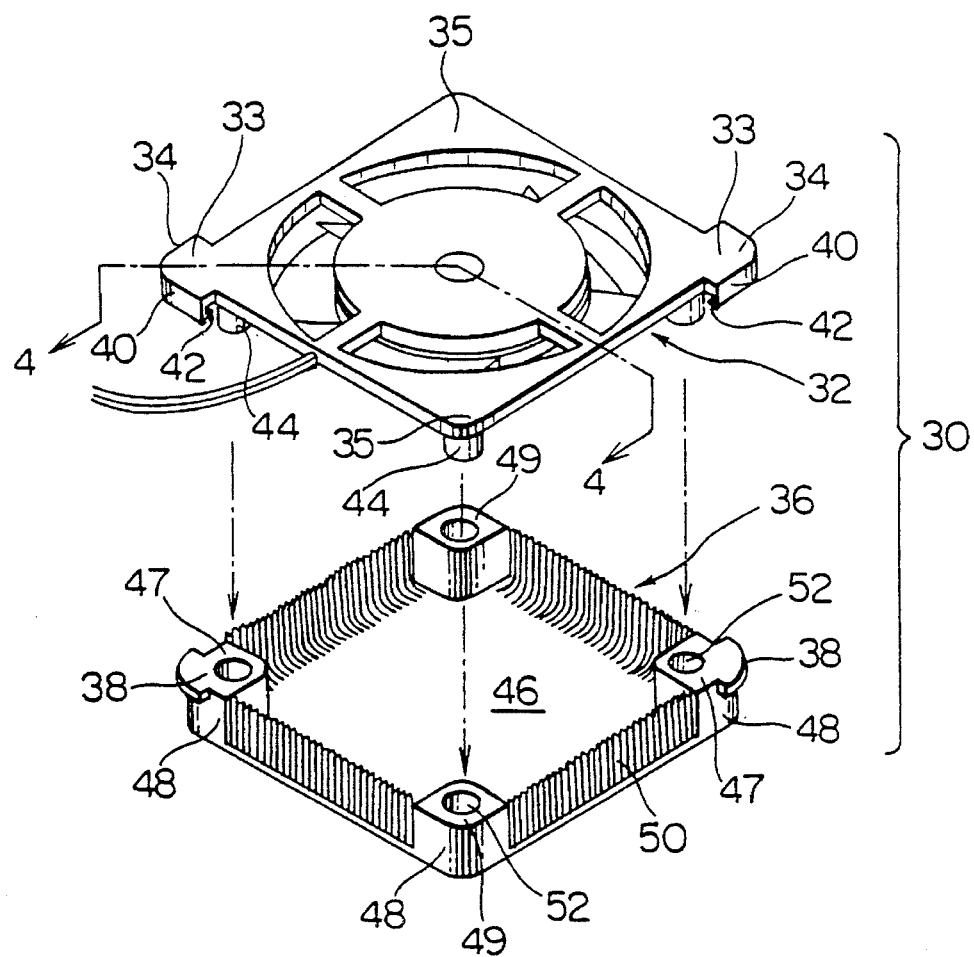
FIG. 3 is an exploded perspective view of a first embodiment of a heat sink fan according to the present invention.
Figure 4:
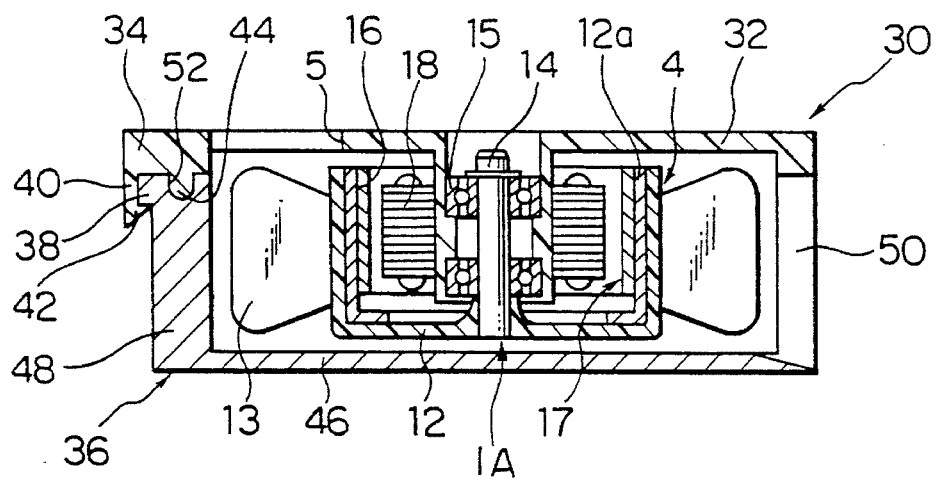
FIG. 4 is a cross-sectional view along line 4—4 of FIG. 3.
Figure 5:
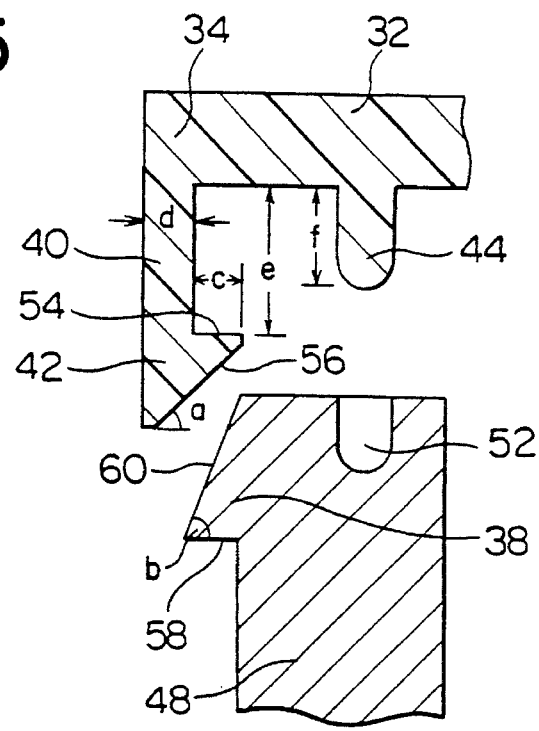
FIG. 5 is a longitudinal cross-sectional view of the mechanically interlocking mechanism of the first embodiment.

A first embodiment of a heat sink fan 30 according to the present invention as shown in FIGS. 3 to 5 differs from the heat sink fan 1 of the conventional heat sink fan as shown in FIGS. 1 and 2 in that an upper casing 32 having a generally rectangular shape as viewed from above has a pair of pawl flanges 34 extending horizontally from and preferably formed integral with corners 33 on a diagonal line of the upper casing 32, and a lower casing 36 constituting a heat sink and having a generally rectangular shape as viewed from above has a pair of pawl receiving flanges 38 extending horizontally from and preferably formed integral with corners 47 on a diagonal line of the upper casing 32 corresponding to the above-mentioned diagonal line of the upper casing 32. The pawl flange 34 and the pawl receiving flange 38 constitute an embodiment of a mechanically interlocking mechanism. The other parts and elements, such as a fan motor 1A comprising an impeller 4, vents 5, a cup-shaped rotating member 12, a yoke 12a, blades 13, a rotary shaft 14, bearings 15, a rotor magnet 16, a rotor 17 and a stator 18 and an assembling method are the same as those of the conventional heat sink fan as shown in FIGS. 1 and 2, the detailed description thereof being omitted. In the following, the different parts and operation of the first embodiment from those of the prior art will be described.

The upper casing 32 is made of a flexible material such as a synthetic resin material or a thin metal plate material on each of the corners 33 of the upper casing 32 on a diagonal line is formed the above-mentioned pawl flange 40 from which a suspending portion or an extending portion 40 extends downward. On the lower end of the suspending portion 40 is formed a pawl 42 extending inward of the upper casing 32. Projections 44 having the substantially same diameter extend downward from the lower ends of all corners 33 and 35 of the upper casing 32 and preferably formed integral therewith.

The lower casing 36 is preferably made of a flexible material similarly to the upper casing 32. Similarly to the prior art as shown in FIG. 1, the lower casing 36 comprises a flat bottom portion 46, connecting portions 48 formed on the corners 47 and 49 of the bottom portion 46, and heat dissipating fins 50 erected from four side edges of the bottom portion 46 and disposed between the adjacent connecting portions 48. The pawl receiving flanges 38 are formed on the connecting portions 38 (the corners 47) which are on a diagonal line of the lower casing 36 corresponding to the above-mentioned diagonal line of the upper casing 32. The pawl receiving flange 38 receives the pawl 42 of the corresponding pawl flange 34 of the upper casing 32 when both casings 32 and 36 are connected together.

In the upper end of each connecting portion 48 is formed a blind hone 52 for receiving the corresponding projection 44 provided on the upper casing 32.

Upon assembly, the upper casing 32 previously provided with a fan motor 1A manufactured by assembling the impeller 4, the rotor magnet 12, the rotor 17 and stator 18 and the other elements in a known order is placed on the lower casing 36 with the projections 44 of the upper casing 32 aligned with the corresponding blind holes 52.

The projections 44 of the upper casing 32 are inserted into the blind holes 52 of the lower casing 36 by causing the upper casing 32 to approach the lower casing 36. As the projections 44 of the upper casing 32 enter the blind holes 52 of the lower casing 36, the pawls 42 of the upper casing 32 slide downward along the outer faces of the pawl receiving flanges 38. The suspending portion 40 is elastically moved outward and the pawl 42 slides very smoothly on the pawl receiving flange 38.

When the projections 44 of the upper casing 32 are fully inserted into the blind holes 52 of the lower casing 36, the pawls 42 of the upper casing 32 are disengaged from the outer surfaces of the pawl receiving flanges 38 of the lower casing 38, and elastically engage the lower faces of the pawl receiving flanges 38. As a result, both casings 32 and 36 are set in an accurate position by engagement of the projections 44 of the upper casing 32 with the blind holes 52 of the lower casing 36 and are assembled into an unseparable state by fitting the pawls 42 of the upper casing 32 to the pawl receiving flanges 38 of the lower casing 36.

The operating relationship between the pawl 42 and the corresponding receiving flange 38 will be described with reference to FIG. 5. The pawl 42 comprises a fitting face 54 extending inward substantially perpendicularly from the suspending portion 40 depending from the pawl flange 34 integrally formed on the upper casing 32, and an inclined face 56 extending from the inner edge of the fitting face 54 to the outer edge of the lower end of the suspending portion 40.

The pawl receiving flange 38 comprises a pawl receiving face 58 projecting outward substantially perpendicularly from the respective connecting portion 48, and an inclined face 60 extending from the outer edge of the pawl receiving face 58 to the upper surface of the connecting portion 48. In the upper surface of the connecting portion 48 is formed the blind hole 52 for receiving the projection 44 of the upper casing 32.

An angle of inclination a of the inclined surface 56 of the upper casing 32 defined between the faces 54 and 56 is preferred to be not larger than an angle of inclination b of the lower casing 36 defined between the faces 58 and 60. In other words, it is preferred a≦b. The inclined face 56 slides smoothly on the inclined face 60, and both casings are assembled together very smoothly.

The length c of the fitting face 54 is preferred to be not larger than the thickness d of the suspending portion 40. In other words, it is preferred that c≦d. This maintains the strength of the pawls and prevents damage of the pawls.

It is preferred that the length e of the suspending portion 40 be not smaller than the length f of the projection 44, i.e., e≧f in order to guide the pawl 42 smoothly on the inclined face 60 of the pawl receiving flange 38. Upon assembling both casings, the inside edge of the pawl 42 slides on the inclined face 60 of the pawl receiving flange 38, and the projection 44 is fitted in the blind hole 52 very quickly. It is completely unnecessary to use skillful steps to dispose the upper casing on the lower casing and to assemble both casings by observing their relative position.

In the first embodiment, the upper casing 32 is provided with the pawl flanges 34 and the projections, and the lower casing 36 is provided with the pawl receiving flanges 38 and the blind holes 52. However, such arrangement is not a requisite. If necessary, the upper casing is provided with the pawl flanges and the blind holes, and the lower casing is provided with the pawl receiving flanges and projections. Positions of the upper and lower casings can be reversed, and the fan motor 1A can be fixed to the lower casing. In this embodiment, the bottom portion 46 is composed of a closed plate but may be formed with vent openings. In the other embodiments, the bottom portions may be formed similarly.

When the upper and lower casings are provided on their all corners with the pawls and the pawl receiving flanges, respectively, separation between both casings is further limited.

Figure 6:
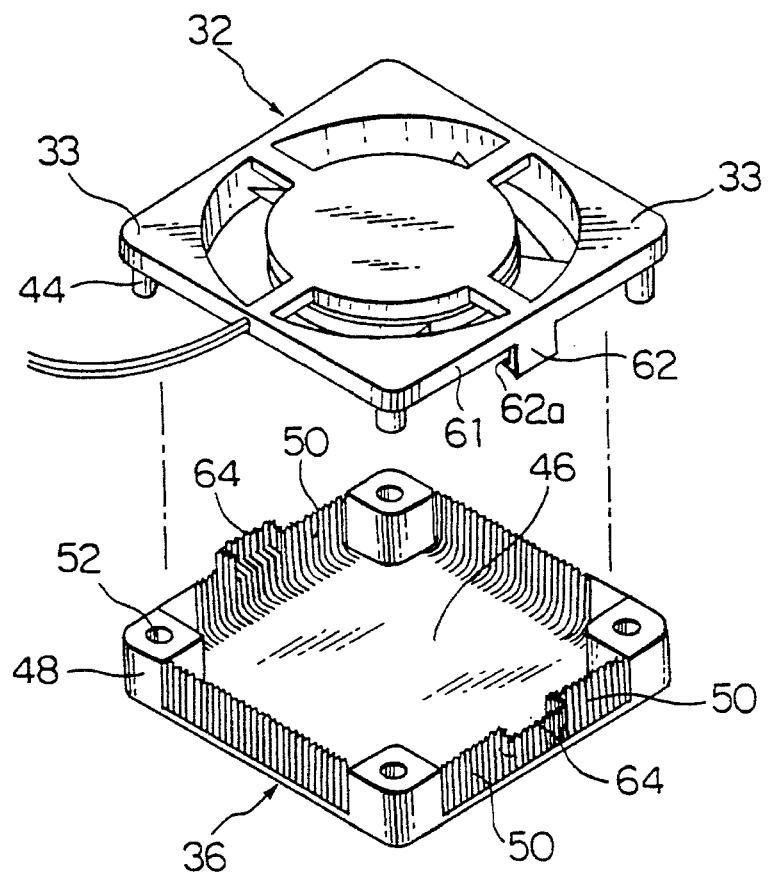
FIG. 6 is an exploded perspective view of a second embodiment of a heat sink fan according to the present invention.

A second embodiment of a heat sink fan according to the present invention is shown in FIG. 6. Pawl flanges or an extending portion 62 having a pawl 62a suspend from the central portions of an opposed pair of sides of an upper casing 32, and pawl receiving flanges 64 are formed on a pair of opposed heat dissipating fins 50 as stepped portions.

According to this embodiment, the flanges of both casings are automatically fitted together and held in a completely tightened state. When an electric instrument on which a heat sink fan is mounted receives shocks during its movement, transportation and operation, both casings are not separated from each other easily, thus preventing fan motor trouble due to separation of both casings.

In the second embodiment, projections 44 are fitted in blind holes 52 formed in connecting portions 48 at corners of upper and lower casings 32 and 36. The pawl flanges 62 and the pawl receiving flanges 64 are engaged with each other to prevent separation of both flanges. This arrangement provides a compact structure and is suited for use in a narrow space in the instrument with which this heat sink fan is provided.

In these two embodiments, it is preferred that pawl flanges and the pawl receiving flanges be provided so as to be oppositely disposed with the centers of both casings disposed therebetween. It was confirmed by various experiments that the upper and lower casings are not held fixed well when the pawl flanges and the pawl receiving flanges are formed on one side of each casing.

Figure 7:
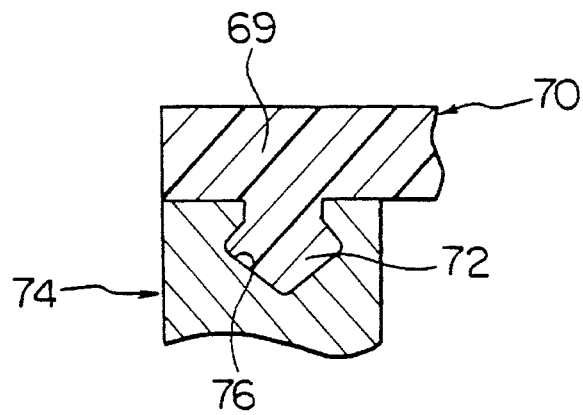
FIG. 7 is a longitudinal cross-sectional view of a mechanically interlocking mechanism of a third embodiment of a heat sink fan according to the present invention.
Figure 8:
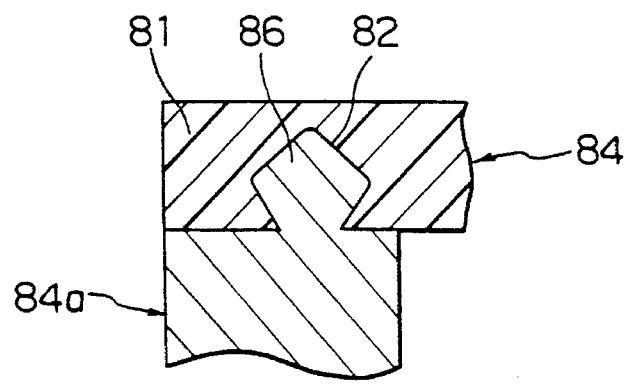
FIG. 8 is a longitudinal cross-sectional view of a mechanically interlocking mechanism of a fourth embodiment of a neat sink fan according to the present invention.
Figure 9:
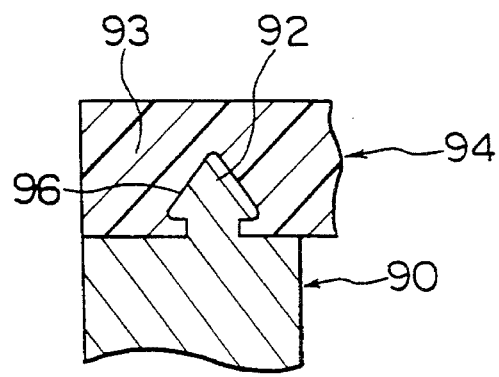
FIG. 9 is a longitudinal cross-sectional view of a fifth embodiment of a heat sink fan according to the present invention.

Third to fifth embodiments of heat sink fans according to are shown in FIGS. 7 to 9, respectively. Each of mechanically interlocking mechanisms of these embodiments is of a snapping type.

In the mechanically interlocking mechanism of the heat sink fan of the third embodiment, projections 72 each having a pentagonal longitudinal cross-section are formed on the corners 69 of an upper casing 70 having a rectangular shape as viewed from above on a diagonal line thereof, and cavities or engaging chambers 76 formed in a lower casing 74 and each having a shape complementary to the shape of the projection 72 of the upper casing 70. The projections 72 are snapped into the corresponding cavities 76. It was confirmed by the inventor of the present invention that the upper and lower casings are firmly held interlocked even if the lower casing is made of non-deformable material, as long as at least projections 72 are made of a somewhat deformable material such as a synthetic resin material.

In the fourth embodiment according to FIG. 8, cavities or engaging chambers 82 are formed in the upper casing 84 having a rectangular shape as viewed from above, and projections 86 are formed on the lower casing 84a also having a rectangular shape as viewed from above. The arrangement of the cavities 82 and the projections 86 is reversed from those of the third embodiment. Each projection 86 has a pentagonal longitudinal cross-section as viewed from above, and each cavity 82 has a complementary shape to the projection 86 so as to snappingly engage it. The upper casing 84 may be made of the same material as that of the upper casing 70 of the embodiment of FIG. 7.

The fifth embodiment of a heat sink fan is shown in FIG. 9 in which projections 86 are modified from the projections of FIG. 8. The projections 92 each having a spade shape in the longitudinal cross-section are formed on corners of an lower casing 90 having a rectangular shape as viewed from above. The cavities or engaging chambers 96 having a shape complementary to that of the projections 92 are formed in corners of the upper casing 94 having a rectangular shape as viewed from above.

The heat sine fan of FIG. 7 is suited for assembling both casings by moving the upper casing to the lower casing. The heat sink fans of FIGS. 8 and 9 are suited for assembling both casings by moving the lower casing to the upper casing. The heat sink fan of the FIG. 8 is adapted to detach the upper casing from the lower casing when required, while the heat sink fan of FIG. 9 is used in the case in which the upper casing is permanently held engaged with the lower casing.

Any one of the embodiments as shown in FIGS. 7 to 9 can be used as a heat sink fan whose casings are not separated from each other when an instrument on which the heat sink fan is mounted does not move or less moves. When, however, the instrument moves much, both casings can be connected together by using the combination of the pawls and the pawl receiving flanges as shown in FIGS. 3 to 5 or the combination of projections and the cavities as shown in any one of FIGS. 7 to 9, in order to obtain further secure mechanical interlocking between the upper and lower casings.

Figure 10:
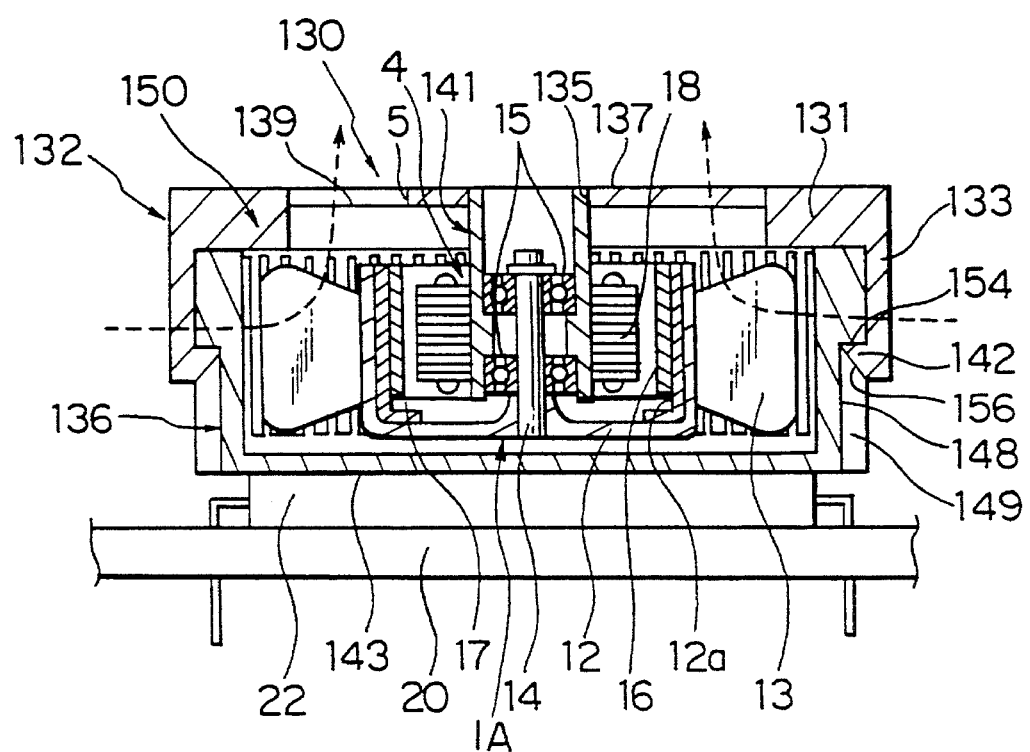
FIG. 10 is an axial cross-sectional view of a sixth embodiment of a heat sink fan according to the present invention.

A sixth embodiment of a heat sink fan according to the present invention is shown in FIGS. 10 to 20. FIG. 10 shows an axial cross-sectional view of the sixth embodiment. A heat sink fan 130 comprises an upper casing 132 having a generally rectangular shape as viewed from above, and a lower casing 136 forming a heat sink and having a generally rectangular shape as viewed from above, the upper casing being fitted to the lower casing.

The upper casing 132 comprises an outer frame portion 131 having a predetermined thickness, an outer periphery 133 of the outer frame portion 131, a disc-shaped central wall portion 137 having a central hole 135 and a thickness smaller than the outer frame portion 131, and a plurality of elongated rectangular radial arms 139 connecting the central wall portion 137 to the outer frame portion 131. Vents 5 are defined by the outer frame portion 131, the central wall portion 137 and radial arms 139.

An impeller 4, a cup-shaped rotating portion 12, a yoke 12a, blades 13, a rotary shaft 14, bearings 15, a rotor magnet 16, a rotor 17 and a stator 18 constituting a fan motor 1A are the same as those of the first embodiment. The upper end portion of a cylindrical sleeve 141 is fixedly fitted in the central hole 135 of the central wall portion 137, and the rotary shaft 14 is provided in the sleeve 141 through the bearings 15.

Figure 11:
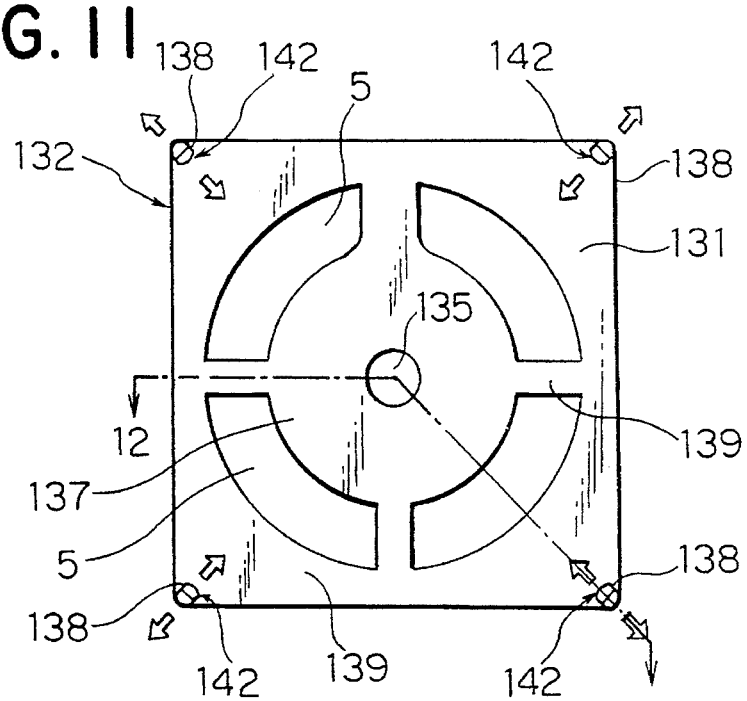
FIG. 11 is a plan view of an upper casing of a sixth embodiment of a heat casing according to the present invention.
Figure 12:
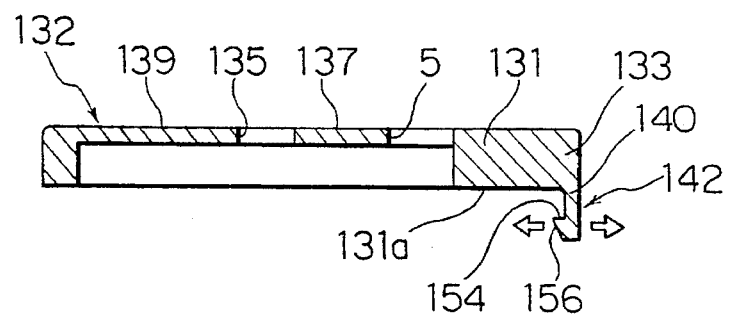
FIG. 12 is a cross-sectional view along line 12—12 of FIG. 11.
Figure 13:
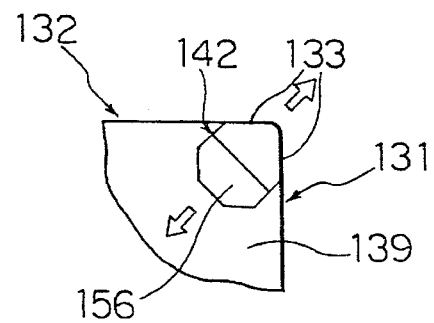
FIG. 13 is plan view of the main portion of the upper casing of the sixth embodiment.
Figure 14:
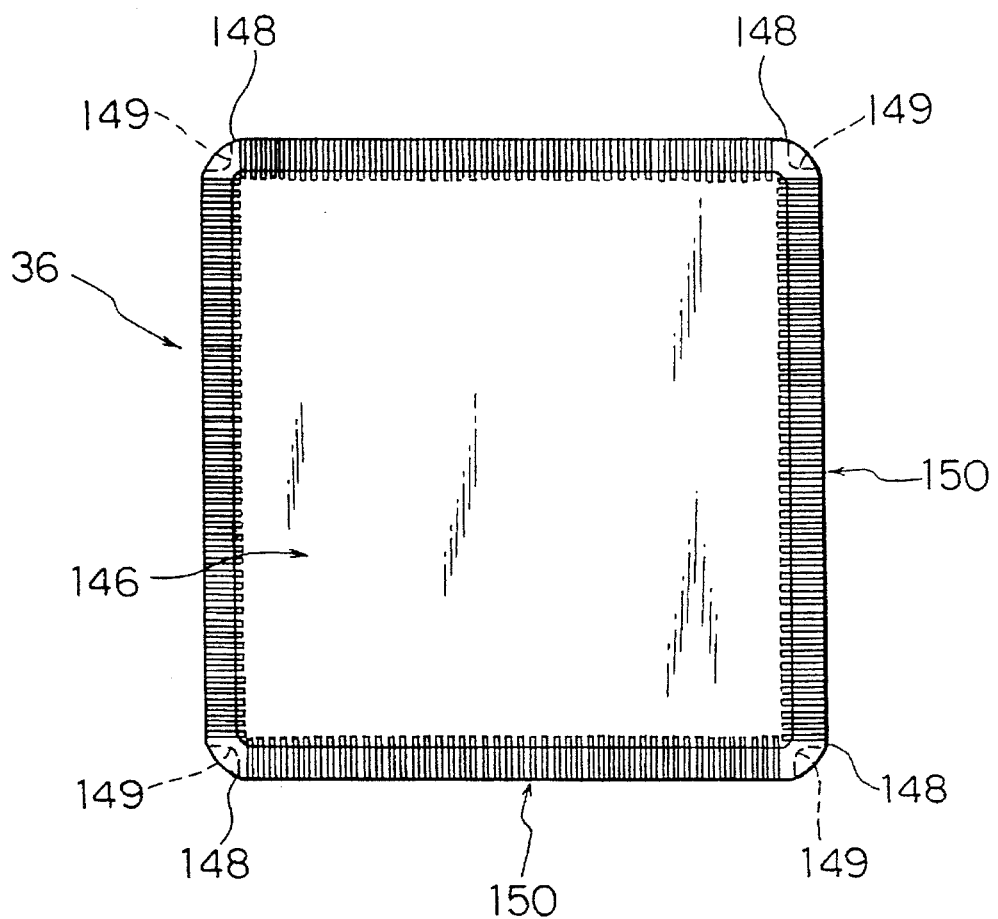
FIG. 14 is a plan view of a lower casing of the sixth embodiment.
Figure 15:
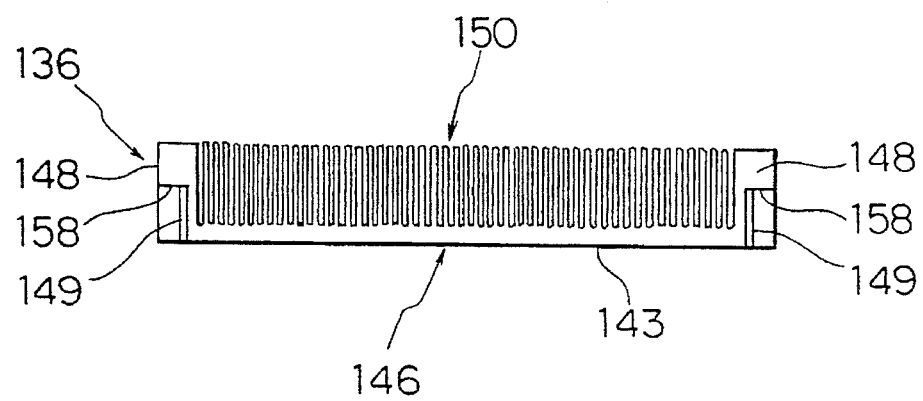
FIG. 15 is a front view of the lower casing of FIG. 14.
Figure 16:
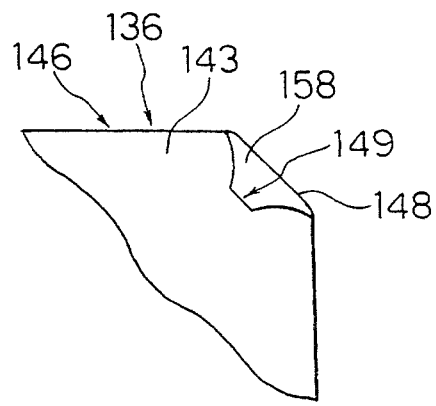
FIG. 16 is a plan view of the main portion of the lower casing of the sixth embodiment.

As shown in FIGS. 11 to 13, suspending portions or extending portions 140 depend from the lower ends of four corners 138 of the outer frame portion 131 on its two diagonal lines. A pawl 142 extending inward of the outer casing 132 is formed on the undersurface 131a of each suspending portion 140. Each pawl 142 comprises a fitting face 154 perpendicular to the outer periphery 133 of the outer frame portion 131 and parallel to the undersurface 131a, and an inclined face 156 facing the inner side of the upper casing 132 and having a trapezoidal shape as viewed from the bottom. The pawl 142 is made of an elastic material and is movable in the directions shown by an arrow in FIG. 11.

Referring to FIGS. 10, and 14 to 16, a lower casing 136 made of a heat conductive material such as aluminum die casting comprises a flat bottom portion 146, heat dissipating fins 150 erected from the four side edges thereof, and corners 140 connecting the side ends of the adjacent heat dissipating fins 150 and each having a generally triangular shape as viewed from the bottom. Each corner 140 constitutes a connecting portion or a support post. The lower casing 136 is placed at its undersurface 143 on a chip 22 for an LSI or the like mounted on an electric component 20 such a circuit substrate. Heat generated in the electric part 20 is transmitted to the heat dissipating fins 150 and dissipated outside of the lower casing 136 by means of the blades 13.

In the corners or pawl receiving flange 148 of the lower casing 136 which correspond to the corners 138 of the upper casing 132 are formed engaging recesses 149 each extending from an intermediate portion of the corner 148 to its lower end. Each engaging recess 149 has a generally trapezoidal shape as viewed from the bottom, and its upper end face forms a pawl receiving face 158 extending parallel to the undersurface 143 of the lower casing 136, for receiving the corresponding pawl 142 of the upper casing 132.

Figure 17:
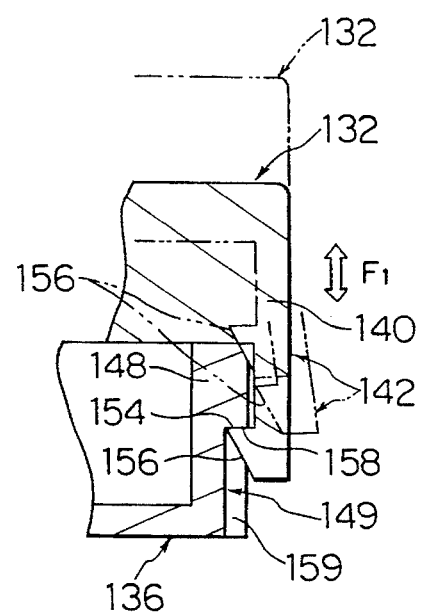
FIG. 17 is a longitudinal cross-sectional view illustrating how to fix the upper casing to the lower casing by means of the mechanically interlocking mechanism according to the sixth embodiment.
Figure 18:
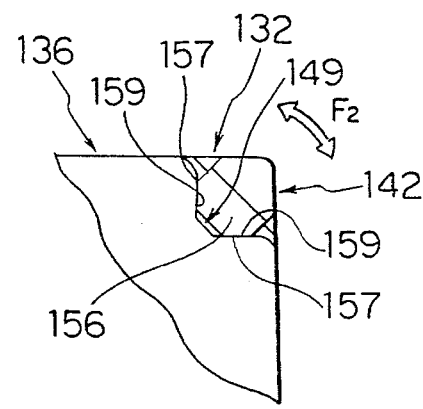
FIG. 18 is a bottom view of the mechanically interlocking mechanism of the sixth embodiment and illustrating how to fix the upper casing to the lower casing.
Figure 19:
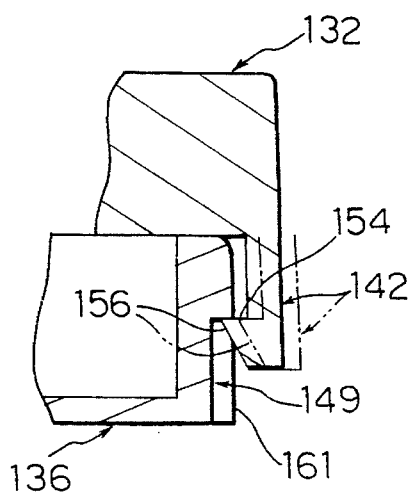
FIG. 19 is a longitudinal cross-sectional view illustrating how to disengage the upper casing from the lower casing by means of the mechanically interlocking mechanism according to the sixth embodiment.

Attachment and detachment of the upper and lower casings 132 and 136 are made in the following ways. As shown in FIG. 17, the engaging recesses 149 are aligned with the corresponding pawls 142, and the upper casing 132 approaches the lower casing 136. The inclined surface 156 of each pawl 142 rides over the corresponding corner 148 of the lower casing 136 and enters the corresponding engaging recess 156 to engage the pawl receiving face 158 of the engaging recess 149. In this state, the movement of the pawl 142 in the directions F1 shown by an arrow in FIG. 17 is restricted. At the same time, both side edges 157 of the inclined face 156 of the pawl 142 engage the both lateral faces 159 of the engaging recess 149, and the pawl 142 is prevented from moving in the directions F2 shown by an arrow in FIG. 18. As a result, the upper casing 132 is securely fixed to the lower casing 136.

Figure 20:
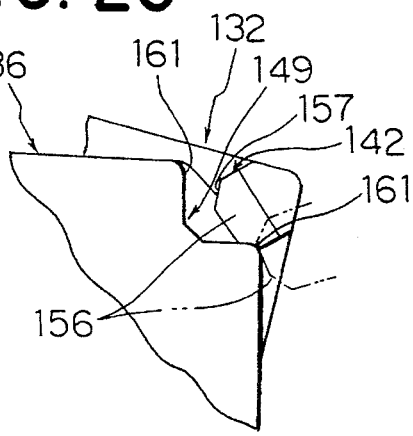
FIG. 20 is a bottom view of the mechanically interlocking mechanism of the sixth embodiment and illustrating how to disengage the upper casing from the lower casing.
Figure 21:
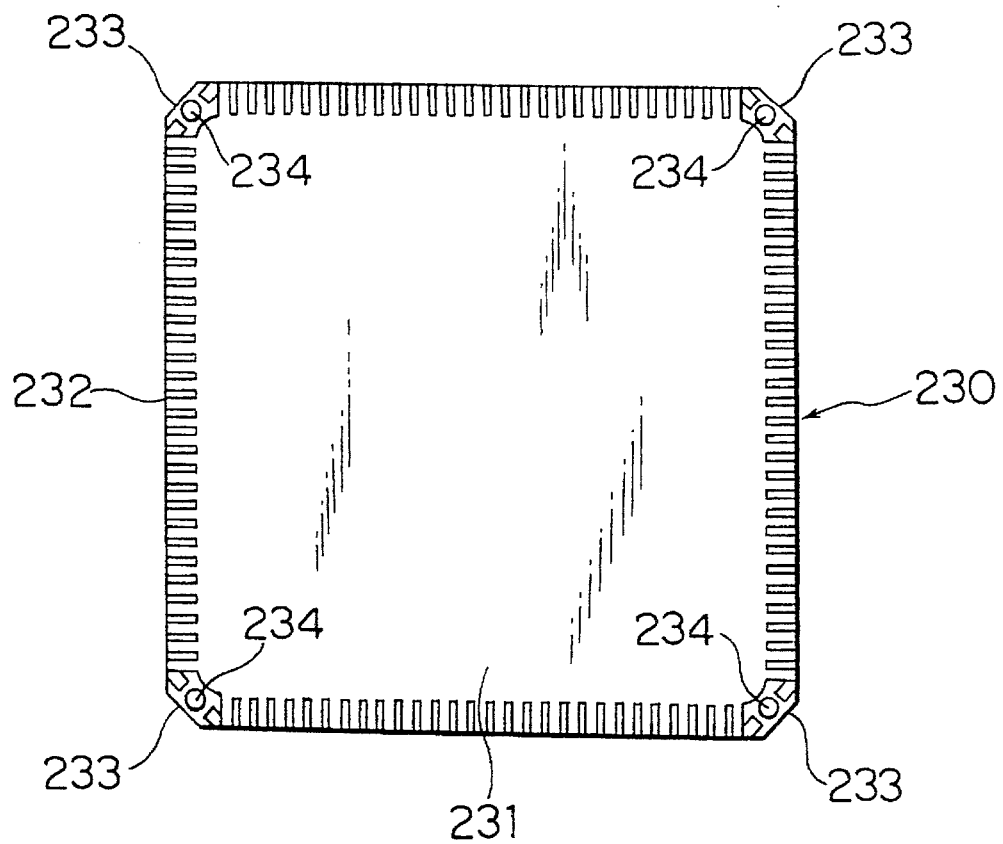
FIG. 21 is a plan view of a seventh embodiment of a heat sink fan according to the present invention.
Figure 22:
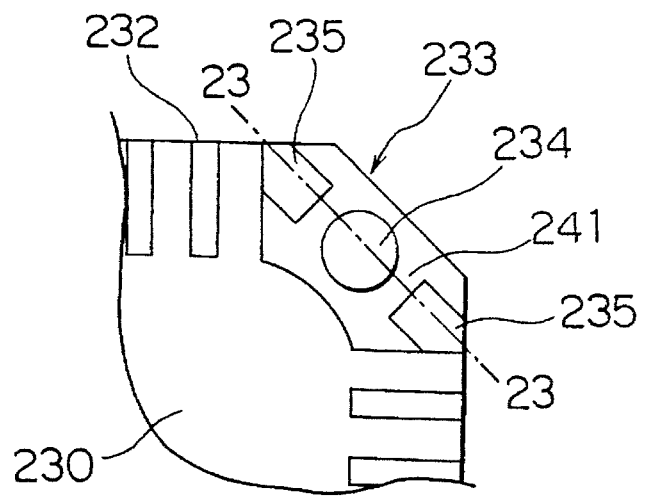
FIG. 22 is an enlarged bottom view of FIG. 21.
Figure 23:
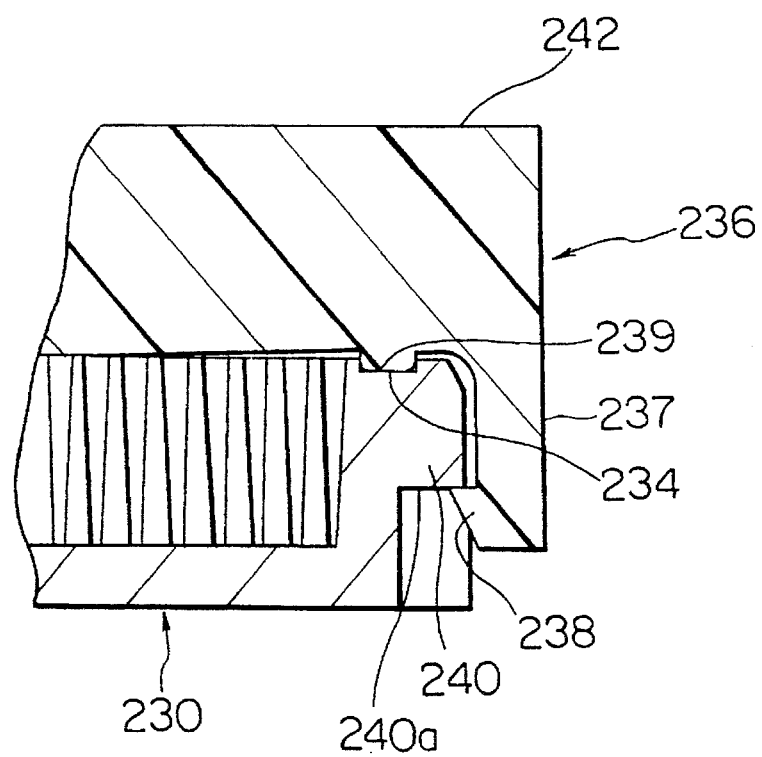
FIG. 23 is an enlarged mechanically interlocking mechanism of a seventh embodiment of a heat sink fan according to the present invention.
Figure 24:
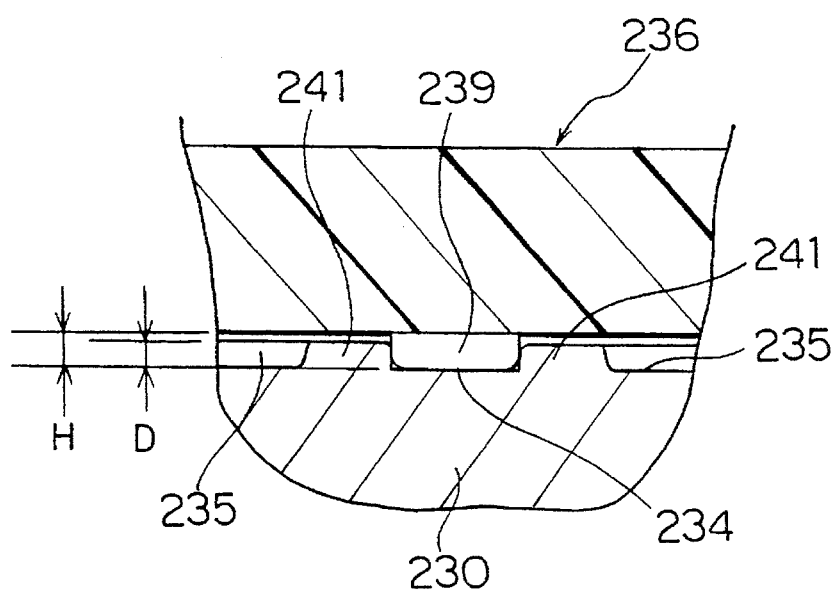
FIG. 24 is an enlarged cross-sectional view of the main portion of FIG. 23.

As shown in FIG. 20, the upper and lower casings 132 and 136 are rotated relatively in this condition. Then, the fitting face 154 of each pawl 142 elastically rides over on one of the outer side edges 161 of the engaging recess 149, and the pawl 142 is released from the engaging recess 149. In this way, the upper casing 132 is disconnected from the lower casing 136.

FIGS. 21 to 24 show a seventh embodiment of a heat sink fan which has the substantially same structure as the sixth embodiment of the heat sink fan of FIGS. 10 to 20, except for a mechanically interlocking mechanism. Thus, the mechanically interlocking mechanism will be described mainly. The lower casing 230 has a bottom portion 231 and heat dissipating fins 232 erected from the four side edges of the bottom potion 231, similarly to the other embodiment.

The upper casing 236 is provided on its four corners with suspending portions (extending portions) 237 extending downward therefrom. A pawl 238 is formed on the lower end (tip end) of each suspending portion 237. The lower casing 230 is provided on its four corners (connecting portions) 233 with stepped portions 230 for receiving the pawls 238 of the upper casing 236. Each corner (connecting portion) 233 of the upper casing 236 has a chamfered outer edge and an arcuated inner edge. The portion of the undersurface of the upper casing 236 which is inside of and adjacent to each corner 232 from which the suspending portion 237 extends is formed with a projection 239 extending downward from the undersurface (interface) of the upper casing 236.

Each corner 233 of the lower casing 230 is provided on its upper surface (interface) with arcuated guide grooves 235 for guiding the projection 239 upon relative rotation between the upper and lower casings 236 and 230, a depression 234 for receiving the projection 239 when the projection 239 vertically aligns the depression 234, and a land 241 defined between the guide grooves 235 and the depression 234 and having the same height as the upper surface (interface) of the lower casing 230. In this case, the height H of the projection 239 is slightly larger than the depth D of the depression 234.

Before assembly of the upper and lower casings 236 and 230, an impeller, a rotor magnet and a stator comprising a fan motor are installed in the upper casing 236 in a conventional way.

The upper casing 236 is placed on the lower casing 230 with its undersurface fixed to the upper surface of an electric part such an LSI in a state in which the four corners 236 of the upper casing 236 are displaced in a rotational direction from the corners (connecting portions) of the lower casing 236. Then, the upper and lower casings 236 and 230 are rotated relatively. The projections 239 of the upper casing 236 are received in the corresponding guide grooves 235 of the lower casing 230, and the pawls 238 of the suspending portions engage the undersurfaces 240a of the stepped portions or pawl receiving flanges 240 of the lower casing 230.

At the end of the connecting rotation of the upper casing 236, the projections 239 are released from the guide grooves 235. The projections 239 ride over the lands 241 due to elasticity of the upper casing 236, and fitted in the depressions 234. Thus, the upper casing 236 is fixed to the lower casing 230.

Since, in this case, H>D and a force which moves the casing 236 upward to separate it from the lower casing 230 in a state in which the pawls 238 engage the stepped portions 240, the pawls 238 are securely engaged with the stepped portions 240. By rotating the upper casing 236 in the reverse direction with respect to the lower casing 230, the upper casing 236 is detached from the lower casing 230.

Figure 25:
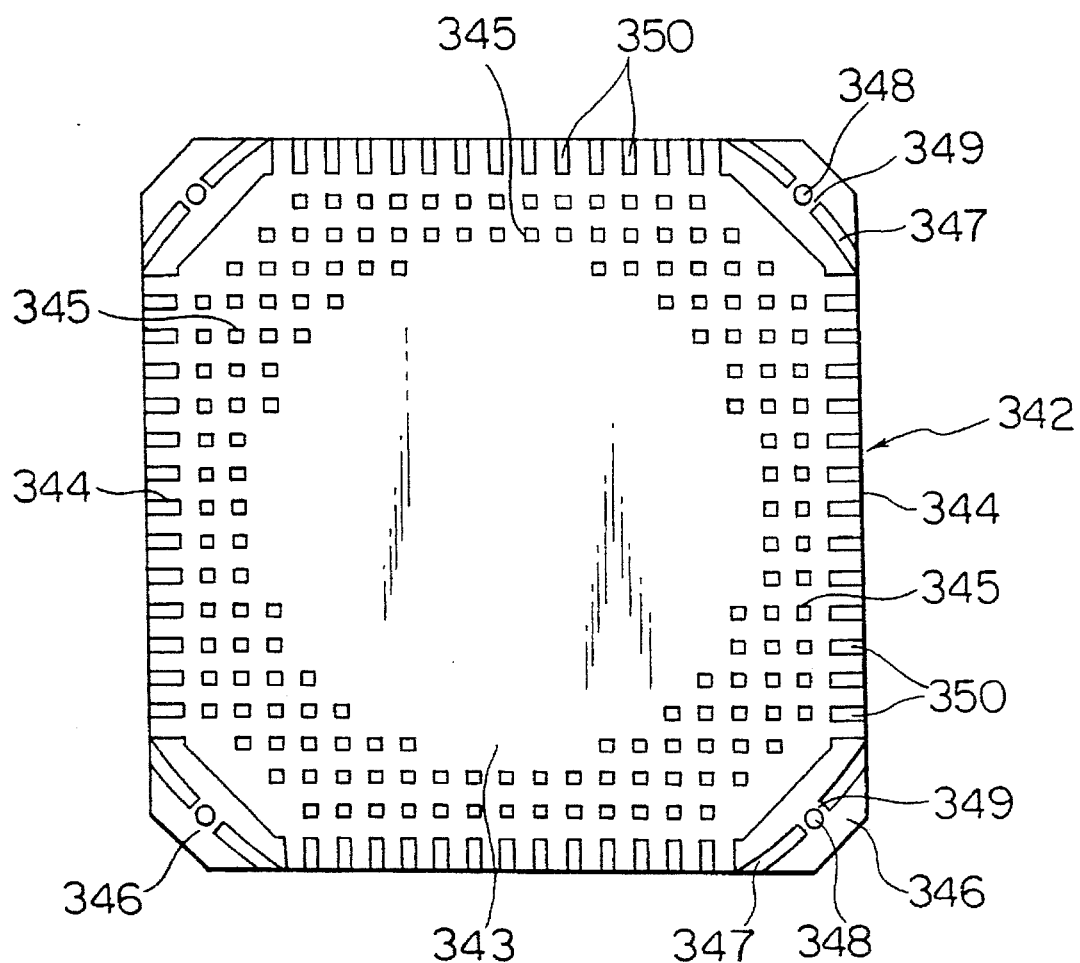
FIG. 25 is a plan view of a lower casing of an eighth embodiment of a heat sink fan according to the present invention.

FIG. 25 is the plan view of a lower casing 342 of an eighth embodiment of a heat sink fan according to the present invention. The structure except for the lower casing is the same as that of the seventh embodiment. The lower casing 342 forming a heat sink has a bottom portion 343 formed with blind holes or, cylindrical holes or other type of punched holes (not shown), and heat dissipating fins 344 erected from the four side edges of the bottom portion 343. Heat radiating pins 345 arranged on the inner surface of the bottom portion 343 at the intersections of the extensions of fin portions 350 of the heat dissipating fins 344 and project upward from the upper surface of the bottom portion 343. Thus, the pins 345 are arranged in a matrix.

The four corners of the lower casing 342 form connecting portions 346 at which a mechanically interlocking mechanism is provided as described below. In each connecting portion 346 are formed a pair of guide grooves 347 for guiding a projection formed on the corresponding corner of an upper casing during relative movement between the upper and lower casings, and a depression 348 for receiving the projection of the upper casing at the end of the attaching relative rotation between the upper and lower casings. A land 349 is formed between the guide grooves 347 and the depression 348 on the connecting portion 346. Thus, the upper casing is securely fixed to the lower casing 342, similarly to the other embodiment.

As described above, the upper and lower casings can be separated from each other by simply making relative movement between them, thereby facilitating maintenance of the heat sink fan and replacement of the fan motor.

The upper and lower casings are fixed together by fitting the projections of the upper casing in the depressions of the lower casing with the pawls of the upper casing engaged with the stepped portion of the lower casing due to elasticity of the upper casing. The upper and lower casings are securely fixed to each other and are not separated from each other unless they are relatively rotated under a large force. Safety is ensured because the upper and lower casings are not easily separated from each other when the heat sink fan receives shocks. This prevents occurrence of trouble of the fan motor due to separation of the upper casing from the lower casing.

Figure 26:
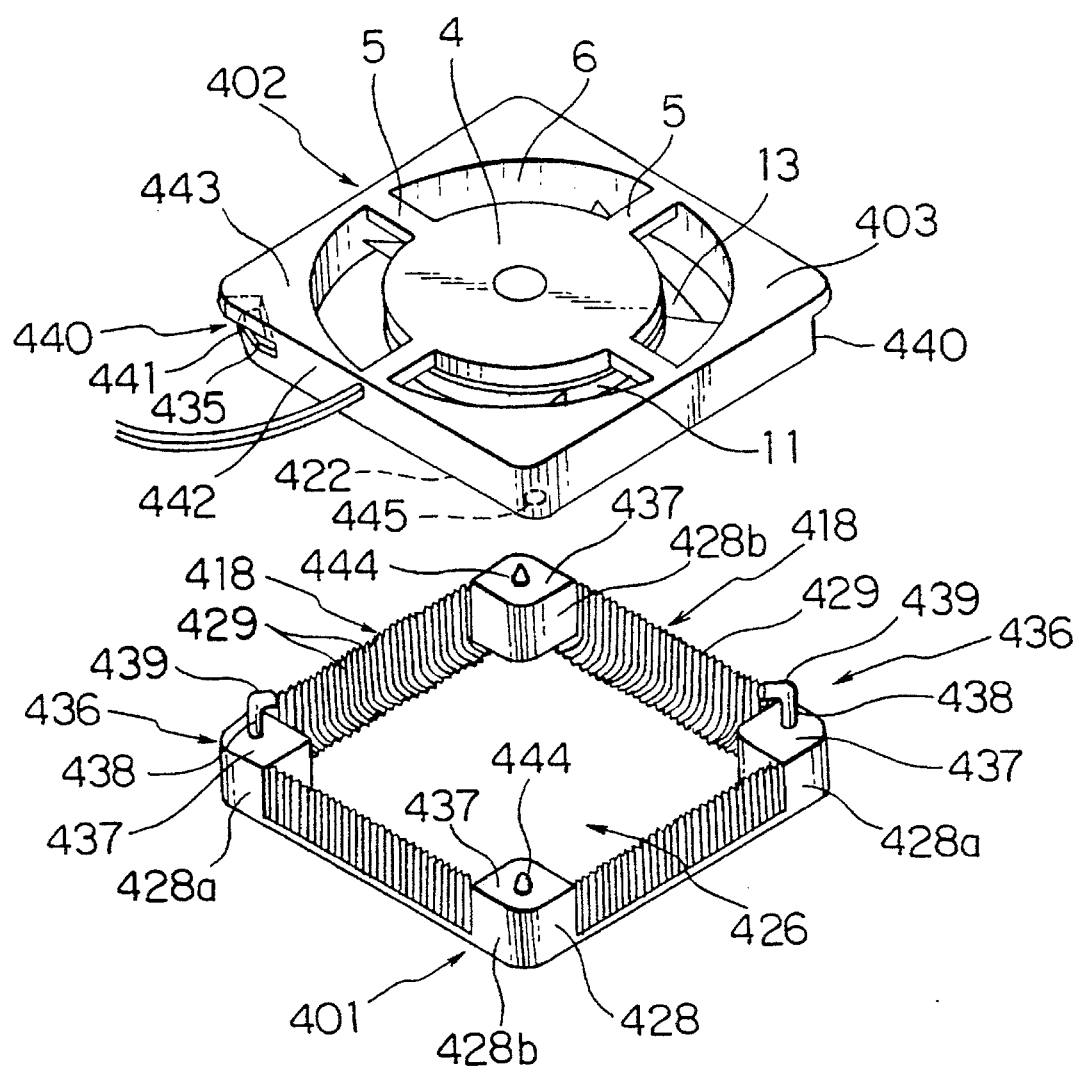
FIG. 26 is an exploded perspective view of a ninth embodiment of a heat sink fan according to the present invention.
Figure 27:
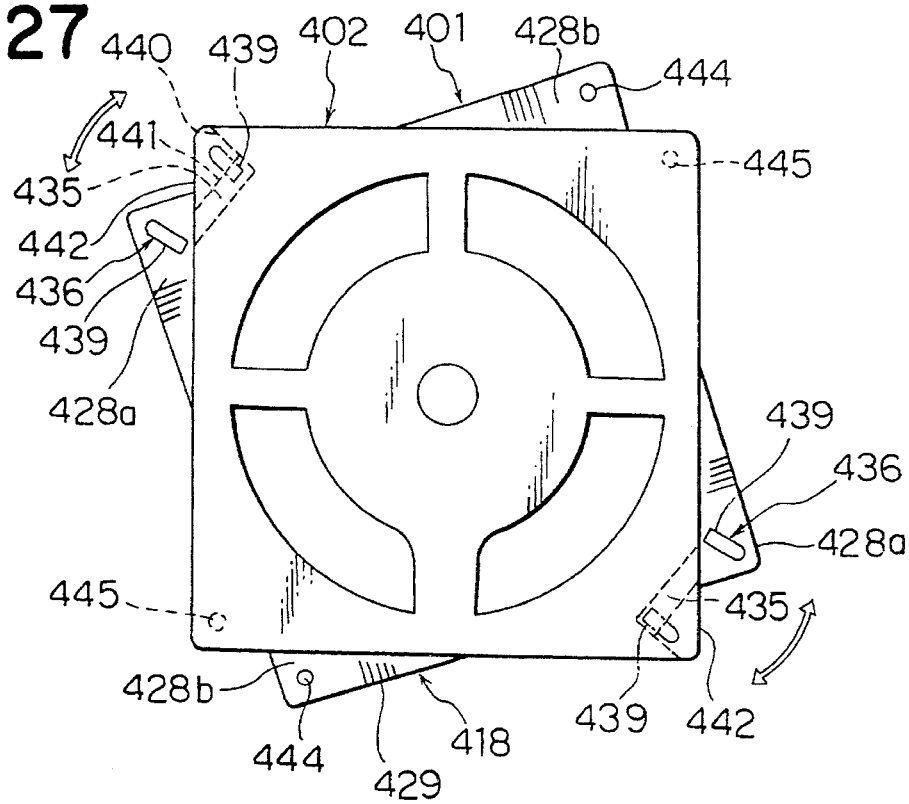
FIG. 27 is a plan view illustrating how to fix the upper casing to the lower casing of the ninth embodiment.

FIGS. 26 and 27 illustrate a ninth embodiment of a heat sink fan according to the present invention. The same parts and elements of this embodiment as those of the sixth embodiment are indicated by the same reference numerals, the description thereof being omitted. A lower casing 401 of this embodiment also has a bottom portion 426 and heat dissipating fins 418, erected from the four side edges of the bottom portion 426 and provided with heat fin portions 429.

The lower casing 401 forming a heat sink has four corners 428a and 438b which also form connecting portions or supporting posts. An L-shaped hook 436 extends from the upper end face of each of the two connecting portions 428a which are on a diagonal line of an upper casing 402. The hook 436 comprises a supporting portion 438 extending perpendicularly from the upper end face of the corner 428a, and an engaging portion 439 extending perpendicularly to the supporting portion 438 toward the center of the lower casing 401.

An upper casing 402 is provided, in the lateral sides of its corners 443 corresponding to the hook 436 of the lower casing 401, with notches 440 having an L shape in a plan view, for admitting the supporting portions 438 of the hooks 436. An engaging groove 435 having an arcuated inner peripheral surface is formed at one edge 441 of the notch 440 in each of the corners 443 so that the engaging groove 435 opens at a lateral side 442 of the upper casing 402 or the outer frame portion 403 of the upper casing 402.

Projections 444 are formed on the upper end faces 437 of the connecting portions 428b of the lower casing 401 on the other diagonal line thereof. Depressions 445 engageable with the projections 444 of the lower casing 401 are formed on the corners of the upper casing 402 which correspond to the projections 444 of the lower casing 401.

The upper casing 402 is placed over the lower casing 401 with the hooks 436 disposed close to portions of the lateral sides 442 of the upper casing 402 which is at the corresponding notches 440. The upper and lower casings 402 and 401 are rotated relatively so that the hooks 436 and the corresponding engaging grooves 435 approach each other. Then, the engaging portions 439 of the hooks 436 engage the engaging grooves 435, and the projections 444 engage the corresponding depressions 445. The upper and lower casings 402 and 401 are restricted in their movements in their relative rotational directions and the perpendicular directions thereto and are fixed together.

The relative rotational movement between the upper and lower casings 402 and 401 in the opposite direction to the engaging rotational movement therebetween disengages the engaging portions 439 of the hooks 436 from the engaging grooves 435 and also disengages the projections 444 from the depressions 445. Then, the upper and lower casings 402 and 401 are disengaged from each other.

The upper and lower casings 402 and 401 are selectively fixed together and disengaged from each other by single rotational movements, and this facilitates maintenance of the heat sink fan and replacement of the fan motor. Since, however, the upper and lower casings 402 and 401 are fixed together so that they are not separated from each other unless they are rotated relatively. Thus, they are not separated from each other even if the heat sink fan is subjected to shocks. This prevents trouble of the fan motor such as its malfunction.

As the upper and lower casings 402 and 401 are not fixed together by means of an adhesive or a screw, the number process and parts does not increase.

Figure 28:
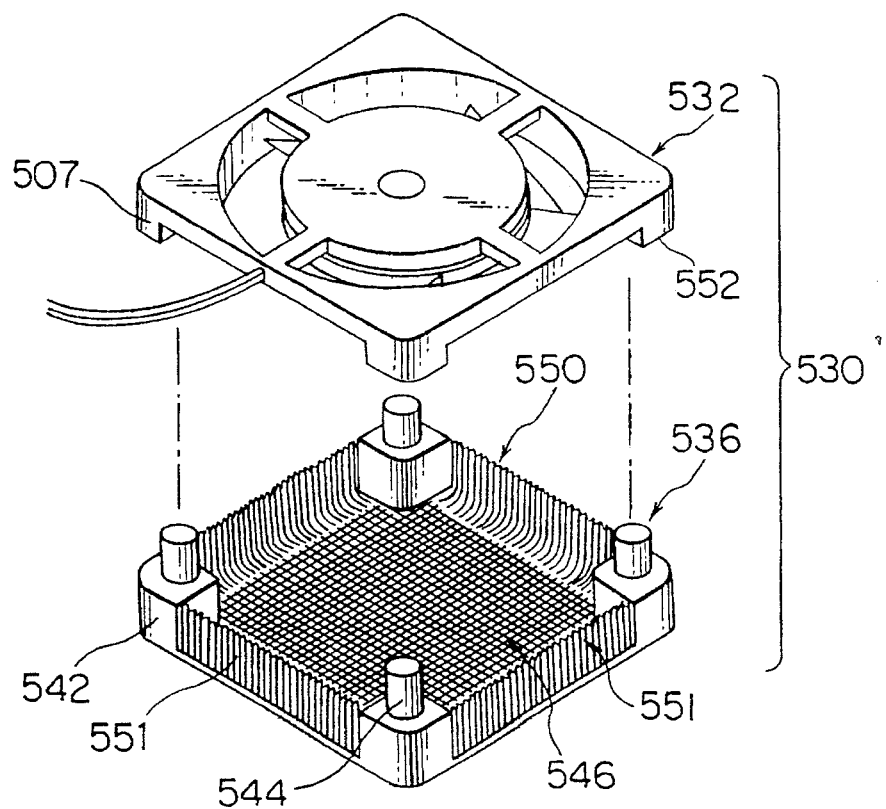
FIG. 28 is an exploded perspective view of a tenth embodiment of a heat sink fan according to the present invention.
Figure 29:
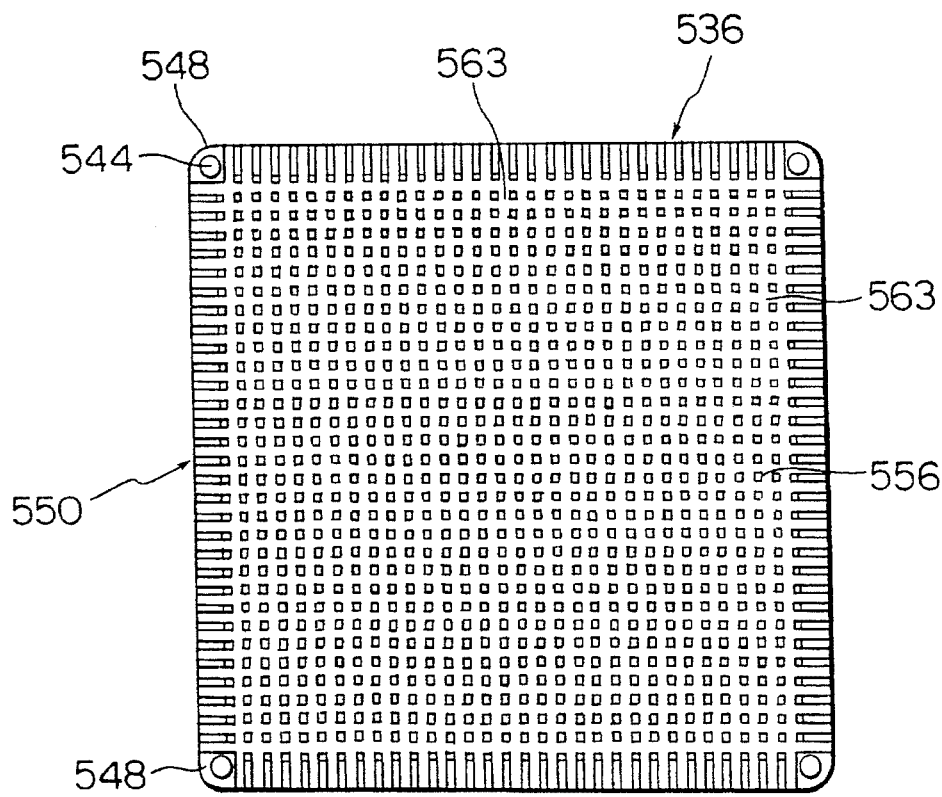
FIG. 29 is a plan view of a lower casing of a tenth embodiment according to the present invention.
Figure 30:
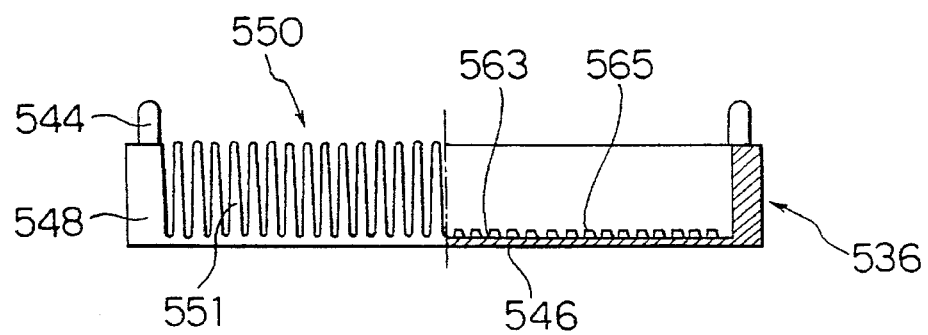
FIG. 30 is a front view of FIG. 29.

FIGS. 28 to 30 show a tenth embodiment of a heat sink fan according to the present invention, which has the same structure as that of either one of the embodiments of FIGS. 1 to 10 or the heat sink fan of FIGS. 1 and 2, except for a lower casing 536. The description will be made by assuming that an upper casing 532 and an fan motor assembled thereto are the same as the upper casing 2 and the fan motor assembled thereto and the Same parts and elements as those of FIGS. 1 and 2 are denoted by the same reference numbers, the description thereof being omitted.

The upper casing 532 of the heat sink casing 530 is made of a synthetic resin and has a generally rectangular shape in a plan view. The corners of the upper casing 532 are formed with connecting portions 507 extending downward. A blind hole 552 is formed in each connecting portion 507 opened at its lower end face so as to receive respective one of projections 544 formed on the corners of a lower casing 536 as will be described later.

Like the lower casing 3 as shown in FIGS. 1 and 2, the lower casing 536 made of a heat conductive material such as aluminum die casting comprises a bottom portion 546, the projections 544 having the same diameter and formed on the four corners of the bottom portion 546, and heat dissipating fins 550 erected from the four side edges of the bottom plate 546 and disposed between the adjacent connecting portions 507.

The bottom portion 546 of the lower casing 536 has a thickness of 2 mm, and has an inner surface provided with heat dissipating grooves 563 each having a thickness of 1 mm. The heat dissipating grooves 563 lie on the extension of the spaces between adjacent fin portions 551 of heat dissipating fins 550. One group of parallel heat dissipating grooves 563 extending between an opposed pair of the heat dissipating fins 550 are formed by a feed of a plurality of cutters, and then another group of parallel heat dissipating grooves 563 extending between the other opposed pair of heat dissipating fins 550 are formed by a feed of a plurality of cutters, so that the two groups of parallel grooves 563 crossing perpendicularly to each other are formed into a lattice structure.

Heat dissipating fins 550 which each have a height of 1 mm and are on the extension of the heat dissipating fins 550 are formed by the heat dissipating grooves 563. Provision of the heat dissipating grooves 563 on the bottom portion 546 makes large the surface area of the bottom portion 546 which dissipates heat. Thus, heat dissipating effect is enhanced.

Upon assembly of the upper casing 532 and the lower casing 536, the parts of a fan motor including an impeller are fixed to the upper casing 532 in a conventional way, and the upper casing 532 is placed over the lower casing 536 with the blind holes 552 of the upper casing 532 aligned with the projections 544 of the lower casing 536. The upper and lower casings 532 and 536 approach each other, and the projections 544 are inserted into the corresponding blind holes 552. In this way, both casings are fixed to each other accurately.

In this embodiment, the blind holes 552 are formed in the upper casing 532 and the projections 544 are formed on the lower casing 536. However, this arrangement may be reversed. Further, the positions of the upper and lower casings may be reversed. Still further, the fan motor may be fixed to the lower casing.

The shape of the heat dissipating grooves 563 and the method of their formation are not limited to this embodiment, but various modifications are possible. For example, the heat dissipating grooves may be formed by a mold. When, for example, a lower casing 536 is formed integral with heat dissipating fins 550 by aluminum die casting, heat dissipating grooves may be formed together with the lower casing. Heat dissipating grooves may be formed in the inner surface of the bottom portion of the lower casing by pressing.

Figure 31:
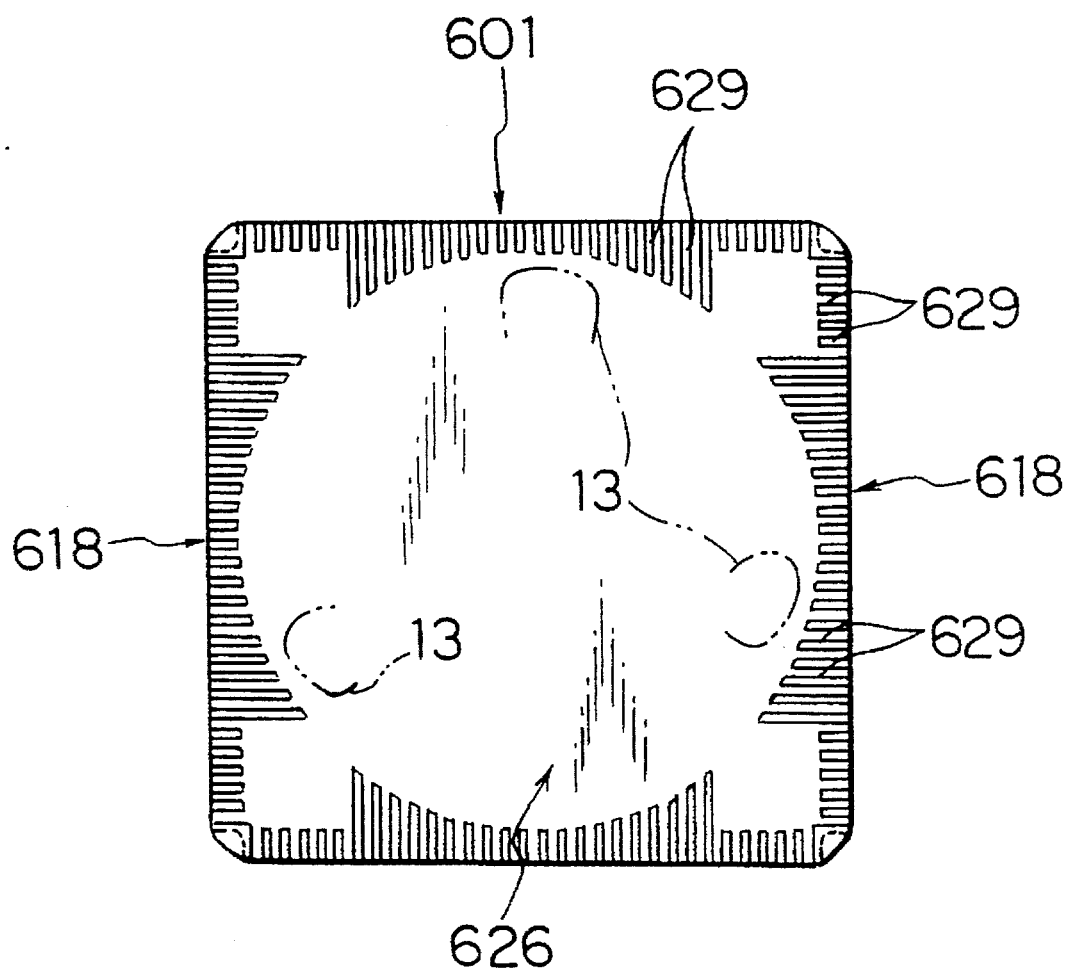
FIG. 31 is a plan view of a modification of the lower casing of the tenth embodiment.

FIG. 31 shows a modification of the embodiment of FIG. 10. Fin portions 618 extend, on the inner surface of the bottom portion 626 of a lower casing 601, from heat dissipating fins 618 on the four side edges of the bottom portion 626 to the vicinity of the blades of a fan motor fixed to an upper casing. Thus, the surface area for dissipating heat of the lower casing is increased to enhance heat dissipating efficiency.

What is claimed is:

1. A heat sink fan comprising:

a fan motor having blades;

a first casing having a plurality of corners and one surface and holding said fan motor at said one surface;

a second casing including a flat bottom portion having side edges, heat dissipating fins extending perpendicularly from said side edges, and corners defined between adjacent heat dissipating fins facing said one surface of said first casing; and mechanically interlocking means for mechanically locking together said first and second casing; wherein said first and second casings have centers; and said mechanically interlocking means comprises extending portions at said corners of said first casing each having a pawl, and a projection formed thereon, and facing said corners of said second casing, stepped portions formed on said corners of said second casing for interengagement with said pawls on relative rotation of said casings, and depressions formed in said corners of said second casing for receiving said projections and for securing the casings against relative rotation and pawl-step disengagement.

2. A heat sink fan according to claim 1, wherein each of said pawl comprises a fitting face substantially parallel to said one surface of said first casing and extending inward of said heat sink fan and an inclined face contiguous to said pawl, and said pawl receiving portion includes a pawl receiving flange comprising a pawl receiving face substantially parallel to said one surface of said first casing and extending outward of said heat sink fan and an inclined face contiguous to said pawl receiving face, and wherein an angle defined between said fitting face and said inclined face contiguous thereto is not larger than an angle defined between said pawl receiving face and said inclined face contiguous thereto.

3. A heat sink fan according to claim 2, wherein said fitting face of said pawl has a depth and said extending portion has a thickness; and said depth is not larger than said thickness.

4. A heat sink fan according to claim 1, wherein said pawls are provided on said corners of said first casing on at least one diagonal line of said first casing, and said pawl receiving flanges formed on said corners of said second casing corresponding to said corners of said first casing on which said pawls are formed.

5. A heat sink fan according to claim 1, wherein said mechanically interlocking means includes at least one guide groove extending in a circumferential direction with respect to said corners of said first and second casings and directed toward said depression for guiding said projection to said depression.

6. A heat sink fan according to claim 5, wherein each of said corners of said other casing has a raised land in which said depression and said guide groove are formed.

7. A heat sink fan according to claim 6, wherein said projection and said land each have heights, and said height of said projection is not less than said height of said land.

* * * * *